US011460289B2

(12) United States Patent
Ausserlechner

(10) Patent No.: US 11,460,289 B2
(45) Date of Patent: Oct. 4, 2022

(54) MAGNETIC SENSOR USING MULTIPLE GRADIOMETERS FOR ANGLE DETECTION

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 288 days.

(21) Appl. No.: 15/982,573

(22) Filed: May 17, 2018

(65) Prior Publication Data

US 2018/0335294 A1    Nov. 22, 2018

Related U.S. Application Data

(60) Provisional application No. 62/509,570, filed on May 22, 2017.

(51) Int. Cl.
| | | |
|---|---|---|
| *G01B 7/30* | (2006.01) | |
| *G01R 33/022* | (2006.01) | |
| *G01R 33/028* | (2006.01) | |
| *G01R 33/09* | (2006.01) | |
| *G01D 5/14* | (2006.01) | |
| *G01D 3/036* | (2006.01) | |

(52) U.S. Cl.
CPC .............. *G01B 7/30* (2013.01); *G01D 3/036* (2013.01); *G01D 5/145* (2013.01); *G01R 33/022* (2013.01); *G01R 33/028* (2013.01); *G01R 33/091* (2013.01); *G01R 33/093* (2013.01)

(58) Field of Classification Search
CPC .......... G01B 7/30; G01D 5/145; G01D 3/036; G01R 33/022; G01R 33/02; G01R 33/028; G01R 33/091; G01R 33/093
See application file for complete search history.

(56) References Cited

U.S. PATENT DOCUMENTS

| | | | | |
|---|---|---|---|---|
| 6,288,533 | B1* | 9/2001 | Haeberli | A61K 48/00 |
| | | | | 324/207.12 |
| 9,671,214 | B2* | 6/2017 | Ausserlechner | G01B 7/30 |
| 2015/0022192 | A1* | 1/2015 | Ausserlechner | G01B 7/30 |
| | | | | 324/207.25 |
| 2015/0137796 | A1* | 5/2015 | Ausserlechner | G01D 5/142 |
| | | | | 324/207.2 |
| 2016/0334242 | A1* | 11/2016 | Ausserlechner | G01D 5/165 |
| 2020/0124398 | A1* | 4/2020 | Ausserlechner | G01D 5/165 |

* cited by examiner

*Primary Examiner* — Rishi R Patel
(74) *Attorney, Agent, or Firm* — Harrity & Harrity, LLP

(57) ABSTRACT

An example device includes a first gradiometer that includes a first set of sensing elements aligned along a first axis, a second gradiometer that includes a second set of sensing elements aligned along a second axis, and a controller. The first set of sensing elements and the second set of sensing elements may be configured to sense a set of magnetic field components that are perpendicular to the rotational axis, wherein the first axis is in a first plane and the second axis is in a second plane, and the first plane and the second plane may be perpendicular to a rotational axis of a rotatable object. The controller may obtain, via the first gradiometer and the second gradiometer, the set of components of the magnetic field. The controller may then determine, based on obtaining the set of components of the magnetic field, the angular position of the rotatable object.

20 Claims, 11 Drawing Sheets

MAGNETIC SENSOR USING MULTIPLE GRADIOMETERS FOR ANGLE DETECTION

RELATED APPLICATION

This application claims priority under 35 U.S.C. § 119 to U.S. Provisional Patent Application No. 62/509,570, filed on May 22, 2017, the content of which is incorporated by reference herein in its entirety.

BACKGROUND

A magnetic sensor is capable of sensing components of a magnetic field applied to the magnetic sensor, such as a magnitude in one or more specific predefined directions and/or the like. The magnetic field generated by a magnet may depend on a magnetization of the magnet, a shape of the magnet, an environment of the magnet, and/or the like. The magnetic sensor may be used to detect, for example, movement, position, an angle of rotation, and/or the like, of the magnet, which may be connected to an object, in a variety of applications, such as a mechanical application, an industrial application, a consumer application, and/or the like.

SUMMARY

According to some implementations, a magnetic sensor arrangement may include a magnetic sensor to determine an angular position of a rotatable object, wherein the rotatable object is configured to rotate about a center of a rotational axis, and wherein the magnetic sensor includes a first gradiometer, with a first set of sensing elements aligned on a first axis, and a second gradiometer with a second set of sensing elements aligned on a second axis, wherein the first gradiometer comprises a first gradiometer center on the first axis and wherein the second gradiometer comprises a second gradiometer center on the second axis, wherein the first axis is in a first plane and the second axis is in a second plane, wherein the first plane and second plane are each perpendicular to the rotational axis, wherein the first gradiometer center is offset from the center of the rotational axis and the second gradiometer center is offset from the center of the rotational axis, such that the magnetic sensor may sense, via the first gradiometer and the second gradiometer, a set of magnetic field components of a magnetic field generated by a magnet, wherein the set of magnetic field components are perpendicular to the rotational axis; wherein the magnet is configured to co-rotate with the rotatable object; and determine, based on sensing the set of magnetic field components, the angular position of the rotatable object.

According to some implementations, a magnetic sensor may include a first gradiometer comprising a first set of sensing elements aligned along a first axis, wherein the first gradiometer comprises a first gradiometer center on the first axis; a second gradiometer comprising a second set of sensing elements aligned along a second axis, wherein the second gradiometer comprises a second gradiometer center of the second axis, wherein the first axis is in a first plane and the second axis is in a second plane, wherein the first plane and the second plane are perpendicular to a center of a rotational axis of a rotatable object wherein the first set of sensing elements and the second set of sensing elements are configured to sense a set of magnetic field components, that are perpendicular to the center of the rotational axis; and a digital signal processor that may obtain, via the first gradiometer and the second gradiometer, the set of magnetic field components, wherein the set of magnetic field components are measured from a magnetic field generated by a magnet configured to co-rotate with the rotatable object; and determine, based on obtaining the set of components of the magnetic field, an angular position of the rotatable object.

An example method may include positioning a magnet on an end of a rotatable object, wherein the rotatable object is configured to rotate about a center of a rotational axis; and positioning a magnetic sensor to be located an axial distance from the magnet and offset from the center of the rotational axis, wherein the magnetic sensor includes a first gradiometer, with a first set of sensing elements aligned on a first axis, and a second gradiometer with a second set of sensing elements aligned on a second axis, wherein the first gradiometer comprises a first gradiometer center on the first axis and wherein the second gradiometer comprises a second gradiometer center on the second axis, wherein the first axis is in a first plane and the second axis is in a second plane, wherein the first plane and second plane are each perpendicular to the rotational axis, wherein the first gradiometer center is offset from the center of the rotational axis and the second gradiometer center is offset from the center of the rotational axis.

DETAILED DESCRIPTION

Figure 1A:
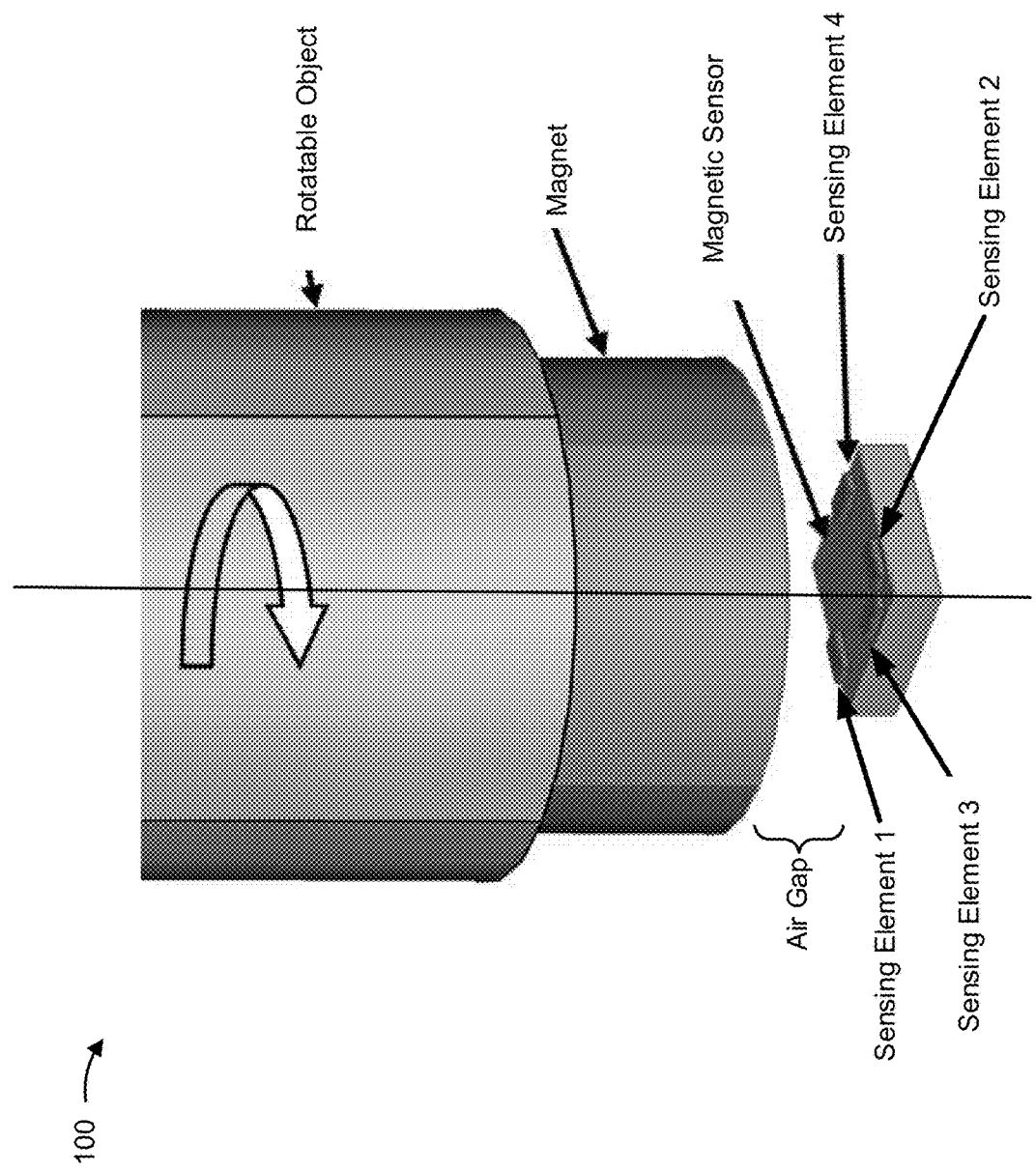
FIGS. 1A and 1B are diagrams of an example implementation described herein.

The following detailed description of example implementations refers to the accompanying drawings. The same reference numbers in different drawings may identify the same or similar elements.

In some instances, magnetic sensors are used to determine an angle of a rotatable object. In embodiments, the magnetic sensors may be used to determine an absolute rotation angle from an instant measurement. For example the magnetic sensors may be used to determine an angle between 0 and 360 degree. The object may be a rotatable shaft that includes a magnet that is configured to co-rotate with the rotatable shaft. For example, the magnet may be fixed to the rotatable shaft, connected to the rotatable shaft, formed as a part of the rotatable shaft, and/or the like. The magnetic sensors may be offset from the rotatable shaft between the ends of the rotatable shaft. However, in such cases, the magnetic sensors may be affected by disturbances in the magnetic field (e.g., due to the disturbance superposing the magnetic field). Accordingly, an output from the magnetic sensor may be erroneous and indicate the wrong angular position of the rotatable shaft.

In some cases, the magnetic sensor may include one or more gradiometers to determine an absolute angular position of the rotatable shaft (or the rotational angle of the rotatable shaft). The gradiometers may use a set of sensing elements and indicate a difference between in the magnetic field components sensed by each of the sensing elements from different respective locations. As such, the one or more gradiometers can suppress disturbances in the magnetic field by sensing the magnetic field from multiple locations (i.e., the respective locations of each of the sensing elements). However, the closer the sensing elements are to one another, the greater the likelihood that a disturbance in the magnetic field is sensed by each of the sensing elements of the gradiometer. As such, a signal from the gradiometer can be relatively small due to the small inhomogeneity of any disturbance (which may be due to the positioning of the magnetic angle sensor relative to the center of the rotational axis of the rotatable shaft). On the other hand, increasing a size of a semiconductor substrate (e.g., a silicon die) of the magnetic sensor that includes the one or more gradiometers to increase the distance between the sensing elements of the one or more gradiometers can be costly. For example, increasing size of the magnetic sensor (e.g., to greater than 5 mm) can require more materials and/or a greater amount of available space to place the magnetic sensor within a system or machine utilizing the magnetic sensor (e.g., a vehicle, an appliance, a manufacturing machine, and/or the like).

Some implementations described herein provide a magnetic sensor arrangement and/or a magnetic sensor that increases a likelihood that a disturbance in the magnetic field is not sensed by each of the sensing elements. To increase the likelihood, the example magnetic sensor arrangement and magnetic sensor may include multiple gradiometers with respective sensing elements that are relatively far from one another (e.g., greater than 2 millimeters (mm)) and positioned relative to a center of a rotational axis of a rotatable object. Further, some implementations described herein may maintain a relatively small size (e.g., with a length, width, and/or radius of less than 5 mm) of the magnetic sensor to detect the angular position. In some implementations described herein, multiple gradiometers may be configured within a magnetic sensor such that a distance between sensing elements is maximized and the multiple gradiometers are arranged on axes in planes that are perpendicular to the center of the rotational axis. In some implementations, the magnetic sensor (or a substrate and/or gradiometers of the magnetic sensor) may be offset from the center of the rotational axis such that one or more centers of the multiple gradiometers are offset from the center of the rotational axis.

Accordingly, some example implementations described herein may increase an accuracy for determining an angular position of a rotatable object. As such, system errors, failures, and/or accidents caused using old techniques can be avoided using one or more of the example implementations of a magnetic sensor arrangement and/or a magnetic sensor described herein.

Figure 1B:
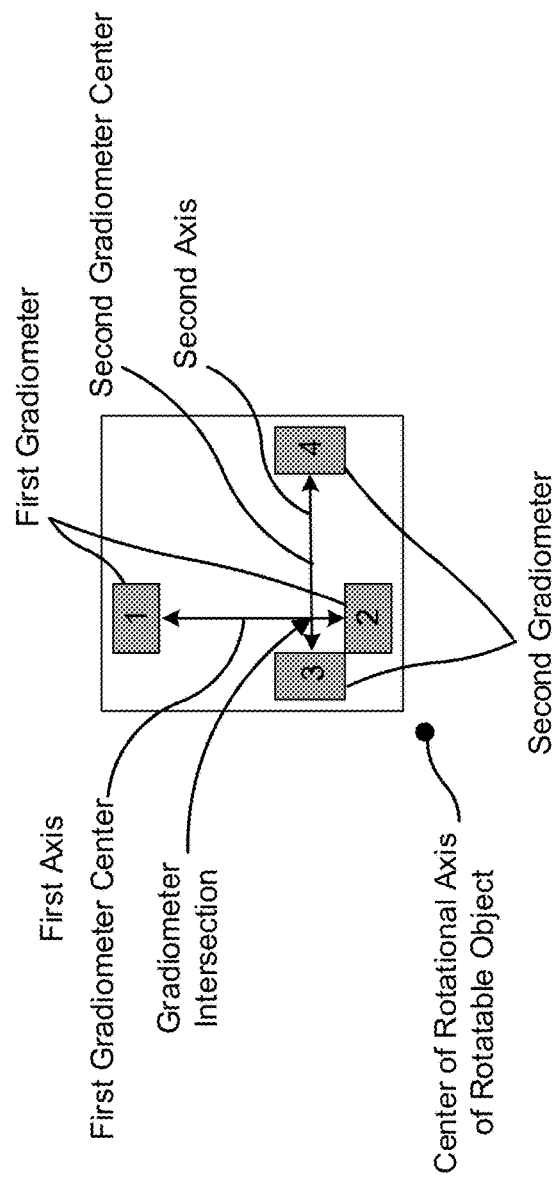

FIGS. 1A and 1B are diagrams of an example implementation 100 described herein. Example implementation 100 includes a magnetic sensor to determine an angular position of a rotatable object. As shown in FIG. 1A, example implementation 100 includes the rotatable object (e.g., a rotatable shaft), a magnet configured to co-rotate with the rotatable object, and the magnetic sensor with multiple sensing elements 1-4 used to determine the angular position of the rotatable object. As shown in FIG. 1B, a top view of the magnetic sensor indicates an example layout of a first gradiometer comprising sensing elements 1 and 2 and a second gradiometer comprising sensing elements 3 and 4.

As shown in FIG. 1A, the magnetic sensor is positioned off the end of the magnet, such that there is an air gap (e.g., which corresponds to an axial distance) between the magnet and the magnetic sensor (or a semiconductor substrate of the magnetic sensor). A size of the example air gap may depend on the size and/or design of the magnetic sensor. For example, the size of the air gap may be based on a distance between the sensing elements of the first gradiometer and the second gradiometer. Additionally, or alternatively, the size of the air gap may depend on the configuration of the magnet (e.g., the size, magnetization, and/or the like). In some implementations, the size of the air gap is less than 10 mm.

As further shown in FIG. 1A, the magnet is fixed to, connected to, or formed as part of an end of the rotatable object. Accordingly, as the rotatable object rotates (e.g., due to some force), the magnet rotates. A magnetic field of example implementation 100 may then be affected by the rotation of the magnet. As such, the first gradiometer and second gradiometer, via the sensing elements, may determine the angular position of the rotatable object based on sensed components of the magnetic field. In some implementations, the set of components of the magnetic field that are sensed by the first gradiometer and the second gradiometer are magnetic field components perpendicular to the rotational axis.

As shown in FIG. 1B, the first gradiometer is comprised of sensing elements 1 and 2 and the second gradiometer is comprised of sensing elements 3 and 4. The sensing elements 1 and 2 form the first gradiometer as they are aligned along a first axis and the sensing elements 3 and 4 form the second gradiometer as they are aligned along a second axis. The first gradiometer may be configured to sense a gradient of a first component of a magnetic field of the magnet (e.g., an x-component) and the second gradiometer may be configured to sense a gradient of a second component of the magnetic field (e.g., a y-component). A first pair of gradient signals can be sensed by determining the first component (x-field component) at the locations of the sensing elements 1 and 2, where the locations are spaced apart at least in the direction of the first component (x-direction). A second pair of gradient signals can be sensed by determining the second field component at the locations of the sensing elements 3 and 4, where the locations are spaced apart at least in the direction of the second field component (y-direction). The first axis may be in a first plane that is perpendicular to the rotational axis and the second axis may be in a second plane that is perpendicular to the rotational axis. In some implementations, the first plane and the second plane are a same plane (i.e., the first plane and the same second plane are identical).

As further shown in FIG. 1B, a first gradiometer center (e.g., a point along the first axis that is a midpoint (half the distance) between sensing element 1 and sensing element 2) and a center of the second gradiometer (e.g., a point along the second axis that is a midpoint (half the distance) between sensing element 3 and sensing element 4) may be offset from the center of the rotational axis. Furthermore, in some implementations, a gradiometer intersection (e.g., where the first axis and the second axis intersect) may be offset from the first gradiometer center and/or the second gradiometer center. Furthermore, the gradiometer intersection may be offset from the center of the rotational axis. In some implementations, the first gradiometer is aligned symmetrically to a second gradiometer relative to a radius that extends from the center of the rotational axis. For example, the sensing elements 1 and 2 may be configured to be symmetrical to the sensing elements 4 and 3, respectively, relative to a radial axis that runs through the gradiometer intersection and the center of the rotational axis.

In some implementations, the gradiometer intersection may be aligned with the center of the rotational axis. In some implementations, the first gradiometer and the second gradiometer may be arranged on a substrate such that sensing element 1 and sensing element 2 are substantially a maximum available distance from one another and sensing element 3 and sensing element 4 are a maximum available distance from one another (e.g., according to a particular designed layout of or relationship between the first gradiometer and the second gradiometer). The maximum distances between sensing elements 1 and 2 and sensing elements 3 and 4, respectively, may be based on the dimensions of the substrate (e.g., a semiconductor chip) of the magnetic sensor that includes the first gradiometer and the second gradiometer.

The magnetic sensor may determine the angular position based on signals received from the first gradiometer and the second gradiometer. In some implementations, the magnetic sensor may normalize a first gradiometer signal from the first gradiometer and a second gradiometer signal from the second gradiometer based on a set of configured signal offsets and signal gains. The configured signal offsets and/or signal gains may be based on design of example implementation 100, one or more characteristics of the magnet, and/or one or more characteristics of the sensing elements. As such, the magnetic sensor may obtain a normalized gradiometer signal from the first gradiometer signal and the second gradiometer signal. Based on the normalized gradiometer signal, the magnetic sensor may then determine the angular position of the magnet, and correspondingly, of the rotatable object.

As such, example implementation 100 may increase inhomogeneity between the sensing elements of the first gradiometer and the second gradiometer, respectively. Furthermore, positioning the magnetic sensor, such that the first gradiometer center and/or the second gradiometer center is offset from the rotational axis can increase the inhomogeneity of the signals captured by the sensing elements of the first gradiometer and second gradiometer. Therefore, the magnetic sensor may more accurately detect a disturbance in the magnetic field of the magnetic sensor arrangement.

Furthermore, example implementation 100 of FIGS. 1A and 1B provides a magnetic sensor arrangement that allows for the magnetic sensor to maintain a relatively small size (e.g., less than 10 mm). For example, by arranging the first gradiometer and second gradiometer on a chip of the magnetic sensor, the magnetic sensor may have the same or smaller dimensions than previously used magnetic sensors. Moreover, positioning the magnetic sensor appropriately, relative to the center of the rotational axis, may not impact the size of the magnetic sensor (e.g., may not require the size of the magnetic sensor to increase).

As indicated above, FIGS. 1A and 1B are provided merely as an example. Other examples are possible and may differ from what was described with regard to FIGS. 1A and 1B.

Figure 2:
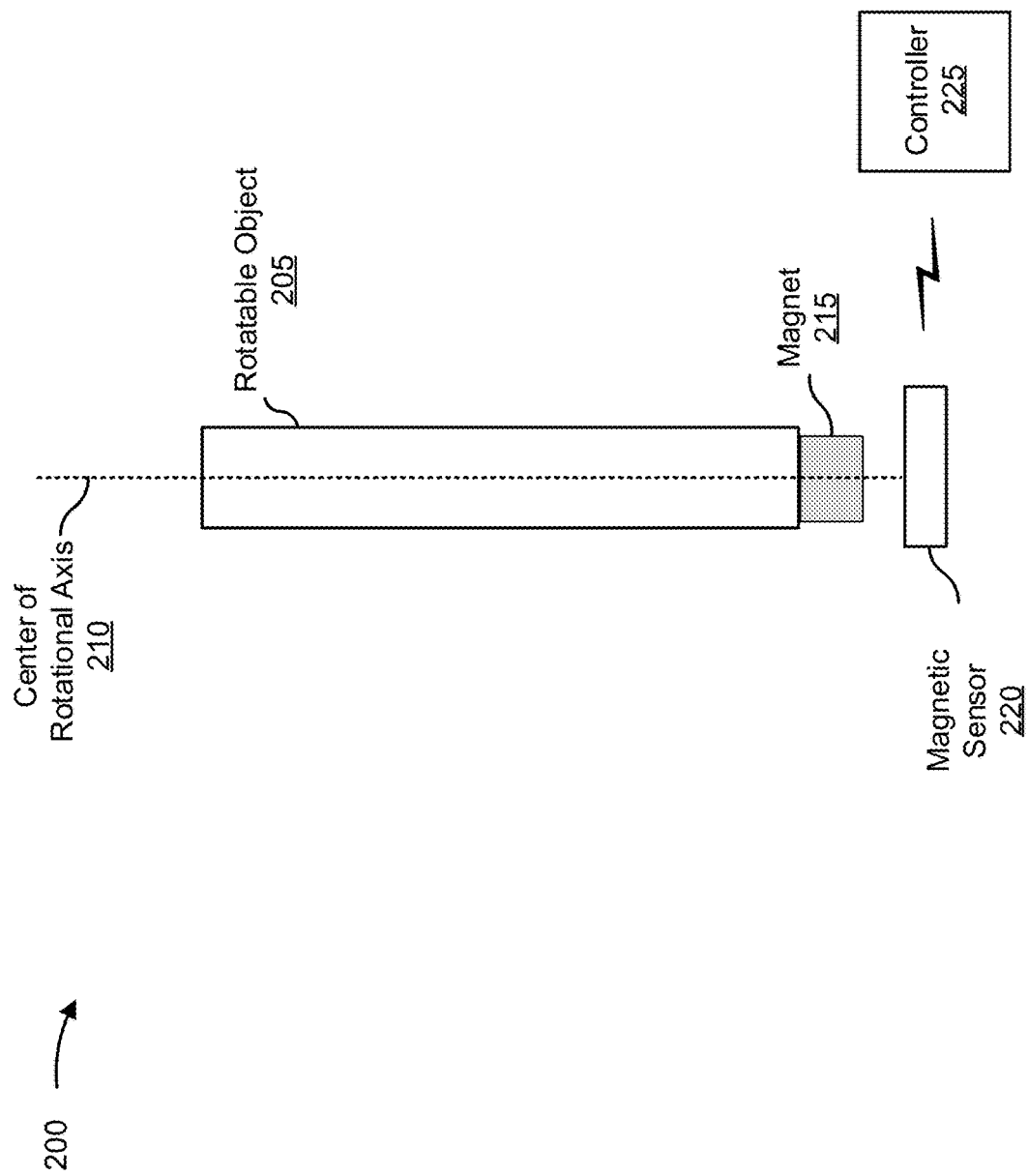
FIG. 2 is a diagram of an example environment in which magnetic arrangements, devices, systems, and/or methods, described herein, may be implemented.

FIG. 2 is a diagram of an example environment 200 in which magnetic arrangements, devices, systems, and/or methods, described herein, may be implemented. As shown in FIG. 2, environment 200 may include a rotatable object 205 (which corresponds to the rotatable shaft of FIGS. 1A and 1B) that may be positioned with respect to a center of a rotational axis 210, a magnet 215 (which may correspond to the magnet of FIGS. 1A and 1B) connected to rotatable object 205, a magnetic sensor 220 (which may correspond to the magnetic sensor of FIGS. 1A and 1B), and a controller 225.

Rotatable object 205 is an object for which an angular position and/or the like is of interest for a given application. For example, rotatable object 205 may be a part of a mechanical system of a machine (e.g., a vehicle, a manufacturing machine, an industrial machine, an agricultural machine, an appliance, and/or the like). In some implementations, rotatable object 205 is cylindrical. In such implementations, the radius of rotatable object 205 may be approximately 5 mm. In some implementations, rotatable object 205 is capable of rotating about the center of rotational axis 210. The center of the rotational axis 210 may correspond to a designed center of a rotational axis associated with rotatable object 205.

In some implementations, rotatable object 205 is connected to (e.g., attached to, coupled with, affixed to, embedded in, formed as a part of, and/or the like) magnet 215. Accordingly, magnet 215 may be configured to co-rotate with rotatable object 205 such that a rotation or angular position of magnet 215 corresponds to a rotation or angular position of rotatable object 205, as described herein.

Magnet 215 may be diametrically magnetized, such that magnet 215 does not generate a rotationally symmetric magnetic field as magnet 215 rotates. For example, magnet 215 may include a first half forming a north pole (N) and a second half forming a south pole (S), such that magnet 215 comprises one pole pair. In some implementations, magnet 215 may, without limitation, comprise more than one pole pair. Additionally, or alternatively, magnet 215 may include a dipole magnet, a permanent magnet, an electromagnet, a magnetic tape, an axially magnetized magnet, and/or the like.

In some implementations, magnet 215 may be comprised of a ferromagnetic material (e.g., Hard Ferrite), and may produce a magnetic field. In some implementations, magnet 215 may further comprise a rare earth magnet, which may be of advantage due to an intrinsically high magnetic field strength of rare earth magnets.

In some implementations, a dimension of magnet 215 (e.g., a length, a width, a height, a diameter, a radius, and/or the like) may be in a range from approximately 1 mm to approximately 15 mm, such as 5 mm. As a particular example, magnet 215 may be cylindrical and have a thickness or height of approximately 5 mm and a radius of approximately 5 mm. In some implementations, magnet 215 may include a recess or notch that receives rotatable object 205. Notably, while magnet 215 may be primarily described as cylindrical according to example implementations herein, magnet 215 may have another shape, such as a ring-shape, a cubical shape, an ellipsoidal shape, a triangular shape, a polygonal shape, and/or the like.

In some implementations, magnet 215 may be configured according to a reference direction associated with magnetic sensor 220. Using a Cartesian coordinate system, with x-, y-, and, z-axes of magnet 215, the z-axis may be the center of rotational axis 210 and the x- and y-axes are perpendicular to each other and the z-axis. In some implementations, at the start of rotation (e.g., when rotatable object 205 and magnet 215 are at rest), the magnetization of magnet 215 may be aligned with the x-axis. In other words, the dipole moment of magnet 215 points in the x-direction. When rotation starts, the direction into which the dipole moment points rotates within the x-y plane of magnet 215.

In some implementations, magnet 215 may be connected to rotatable object 205 in an asymmetric manner. For example, a center axis of magnet 215 may not align with the center of rotational axis 210. Although magnet 215 is shown with sharp edges/corners, edges and/or corners of magnet 215 may be rounded.

Magnetic sensor 220 of FIG. 2 includes one or more apparatuses for sensing one or more components of a magnetic field of magnet 215 for use in determining an angular position of rotatable object 205 (e.g., based on a position of magnet 215 relative to magnetic sensor 220). Magnetic sensor 220 may asymmetrically sense the magnetic field generated by magnet 215 to determine an angular position of magnet 215, and therefore of rotatable object 205. For example, magnetic sensor 220 may include one or more circuits (e.g., one or more integrated circuits) that operate to sense a set of components of the magnetic field produced by magnet 215. According to some implementations, a set of components may include one or more of an intensity of a magnetic field (e.g., a magnetic flux density and/or a magnetic field strength), a magnetic field magnitude, a magnetic field direction, or the like. Accordingly, magnetic sensor 220 may provide an output signal (e.g., to controller 225) that is indicative of a physical quantity (e.g., a component of the magnetic field).

Magnetic sensor 220 may be a three dimensional (3D) magnetic sensor capable of sensing three directional components of a magnetic field (e.g., an x-component corresponding to an x-axis of magnetic sensor 220, a y-component corresponding to a y-axis of magnetic sensor 220, and a z-component corresponding to a z-axis of magnetic sensor 220). For example, magnetic sensor 220 may include a semiconductor substrate that includes sensing elements and/or gradiometers. The semiconductor substrate may be a polygon (e.g., a tetragon, a pentagon, a hexagon, and/or the like) and have an area that is defined by locations of the sensing elements and/or gradiometers. For example, the area may have a length corresponding to a length of a first gradiometer and a width corresponding to a length of a second gradiometer of the semiconductor substrate (e.g., when the first and second gradiometer are configured to be perpendicular to one another). In such a case the area may be a tetragon (e.g., a square, a rectangle, and/or the like). Additionally, or alternatively, the area may have a perimeter that is defined by the locations of the sensing elements and/or gradiometers. For example, the area may be a polygon with vertices defined by locations of the sensing elements or gradiometers. In some aspects, the vertices may correspond to the locations of the sensing elements, and/or the vertices of the polygon may depend on the locations of the sensing elements, such that the vertices of the polygon enable edges of the polygon to form a shape or the area that includes each of the sensing elements or gradiometers of magnetic sensor 220.

In some implementations, the sensing elements and/or the gradiometers of magnetic sensor 220 may be configured to sense a set of magnetic field components (e.g., x-components and y-components) in planes that are perpendicular to the center of the rotational axis 210. In some implementations, magnetic sensor 220 may include an integrated circuit that includes an integrated controller 225 (e.g., such that an output of magnetic sensor 220 may include information that describes a position of magnet 215 and/or a position of rotatable object 205). In some implementations, magnetic sensor 220 may include one or more sensing elements (e.g., which may correspond to the sensing elements of FIGS. 1A and 1B) configured to sense one or more components of the magnetic field produced by magnet 215. The sensing elements may include and/or be configured to form one or more gradiometers, as described herein. In some implementations, magnetic sensor 220 may include an analog-to-digital converter (ADC) to convert analog signals received from the sensing elements into digital signals to be processed (e.g., by a digital signal processor (DSP)) by magnetic sensor 220.

In some implementations, magnetic sensor 220 may be arranged at a position relative to magnet 215 such that magnetic sensor 220 may detect one or more of the components of the magnetic field produced by magnet 215. For example, magnetic sensor 220 may be positioned off an end of rotatable object 205 that includes magnet 215 to detect a magnetic field component of magnet 215 as magnet 215 rotates about rotational axis 210. In some implementations, an air gap (e.g., at least a 1 mm air gap) may be present between magnetic sensor 220 and magnet 215 when magnet 215 rotates about rotational axis 210 near magnetic sensor 220. In some implementations, magnetic sensor 220 may be offset from the center of rotational axis 210. For example, a center of magnetic sensor 220 may not align with the center of rotational axis 210. Furthermore, in some implementations, magnetic sensor 220 may be offset from the center of rotational axis 210 relative to one or more dimensions and/or positions of one or more gradiometers within magnetic sensor 220.

In some implementations, during rotation, magnetic sensor 220 may infer the angular position of magnet 215 based on signals from gradiometers of magnetic sensor 220. The signals may include measurement information indicative of measurements of a sensed magnetic field component made by the respective gradiometers. For example, magnetic sensor 220 may include an x-gradiometer with sensing elements 1 and 2 (which sense magnetic field component $B_x$ and provide measurements of $B_x1$ and $B_x2$, respectively) and a y-gradiometer with sensing elements 3 and 4 (which sense magnetic field component $B_y$ and provide measurements of $B_y3$ and $B_y4$, respectively). Magnetic sensor 220 may normalize a signal ($S_x=B_{x1}-B_{x2}$) from the x-gradiometer and a signal ($S_y=B_{y3}-B_{y4}$) from the y-gradiometer based on corresponding signal gains ($c_x$, $c_y$) and offsets ($\text{off}_x$, $\text{off}_y$) as follows:

$$S_{xn}=S_x*c_x+\text{off}_x, S_{yn}=S_y*c_y+\text{off}_y \quad (1)$$

where $S_{xn}$ corresponds to a normalized signal from the first gradiometer and $S_{yn}$ corresponds to a normalized signal from the second gradiometer. In such cases, the signal gains ($c_x$, $c_y$) may depend on the configuration of the first gradiometer and the second gradiometer within magnetic sensor 220, a design of magnetic sensor 220, and/or one or more characteristics of magnet 215. Furthermore, the offsets ($\text{off}_x$, $\text{off}_y$) may be based on a configuration of the first gradiometer and/or the second gradiometer. Furthermore, magnetic sensor 220 may combine the normalized signals ($S_{xn}$, $S_{yn}$) to obtain a normalized gradiometer signal as follows:

$$S_{xn2}=S_{xn}*c_2+S_{yn} \quad (2)$$

where $c_2$ may be a constant that is based on one or more characteristics of magnetic sensor 220 or environment 200. Finally, from the normalized gradiometer signal, magnetic sensor 220 may calculate the following:

$$\text{phi}=\arctan_2(S_{xn2};S_{yn}) \quad (3)$$

where phi is the angular position of magnet 215 and/or rotatable object 205.

In some implementations, magnetic sensor 220 may be configured with mapping information associated with determining the angular position (or rotational angle) of rotatable object 205 based on the sensed set of components of the magnetic field. Magnetic sensor 220 may store the mapping information in a memory (e.g., a read only memory (ROM) (e.g., an electrically erasable programmable read-only memory (EEPROM)), a random access memory (RAM), and/or another type of dynamic or static storage device (e.g., a flash memory, a magnetic memory, an optical memory, etc.)) of magnetic sensor 220. The mapping information may include information associated with a rotational angle and a set of components of the magnetic field corresponding to the rotational angle. The mapping information may include such information for multiple rotational angles and/or positions of rotatable object 205. In some implementations, magnetic sensor 220 may be configured with the mapping information during a manufacturing process associated with magnetic sensor 220 and/or a rotational angle detection system, a calibration process associated with magnetic sensor 220, a setup process associated with magnetic sensor 220, and/or the like.

During operation, magnetic sensor 220 may sense the set of components of the magnetic field of magnet 215. Magnetic sensor 220 may then compare the sensed set of components of the magnetic field to the mapping information, and determine the rotational angle of rotatable object 205 based on the comparison. For example, magnetic sensor 220 may identify sets of components of the magnetic field, included in the mapping information, that match (e.g., within a threshold or that satisfy a matching threshold) the sensed set of components of the magnetic field. In this example, magnetic sensor 220 may determine the rotational angle of rotatable object 205 as the rotational angle corresponding to the matched mapping information.

Controller 225 includes one or more circuits associated with determining a rotational angle (and/or position) of rotatable object 205, and providing information associated with the rotational angle of rotatable object 205. For example, controller 225 may include a processor, an integrated circuit, a control circuit, a feedback circuit, and/or the like. Controller 225 may receive input signals from one or more sensors (e.g., from a digital signal processor (DSP) of magnetic sensor 220), such as one or more magnetic sensors 220, may process the input signals (e.g., using an analog signal processor, a DSP, and/or the like) to generate an output signal, and may provide the output signal to one or more other devices or systems. For example, controller 225 may receive one or more input signals from magnetic sensor 220, and may use the one or more input signals to generate an output signal comprising the angular position of rotatable object 205 to which magnet 215 is connected.

The number and arrangement of apparatuses shown in FIG. 2 are provided as an example. In practice, there may be additional apparatuses, fewer apparatuses, different apparatuses, or differently arranged apparatuses than those shown in FIG. 2. Furthermore, two or more apparatuses shown in FIG. 2 may be implemented within a single apparatus, or a single apparatus shown in FIG. 2 may be implemented as multiple, distributed apparatuses. Additionally, or alternatively, a set of apparatuses (e.g., one or more apparatuses) of environment 200 may perform one or more functions described as being performed by another set of apparatuses of environment 200.

Figure 3:
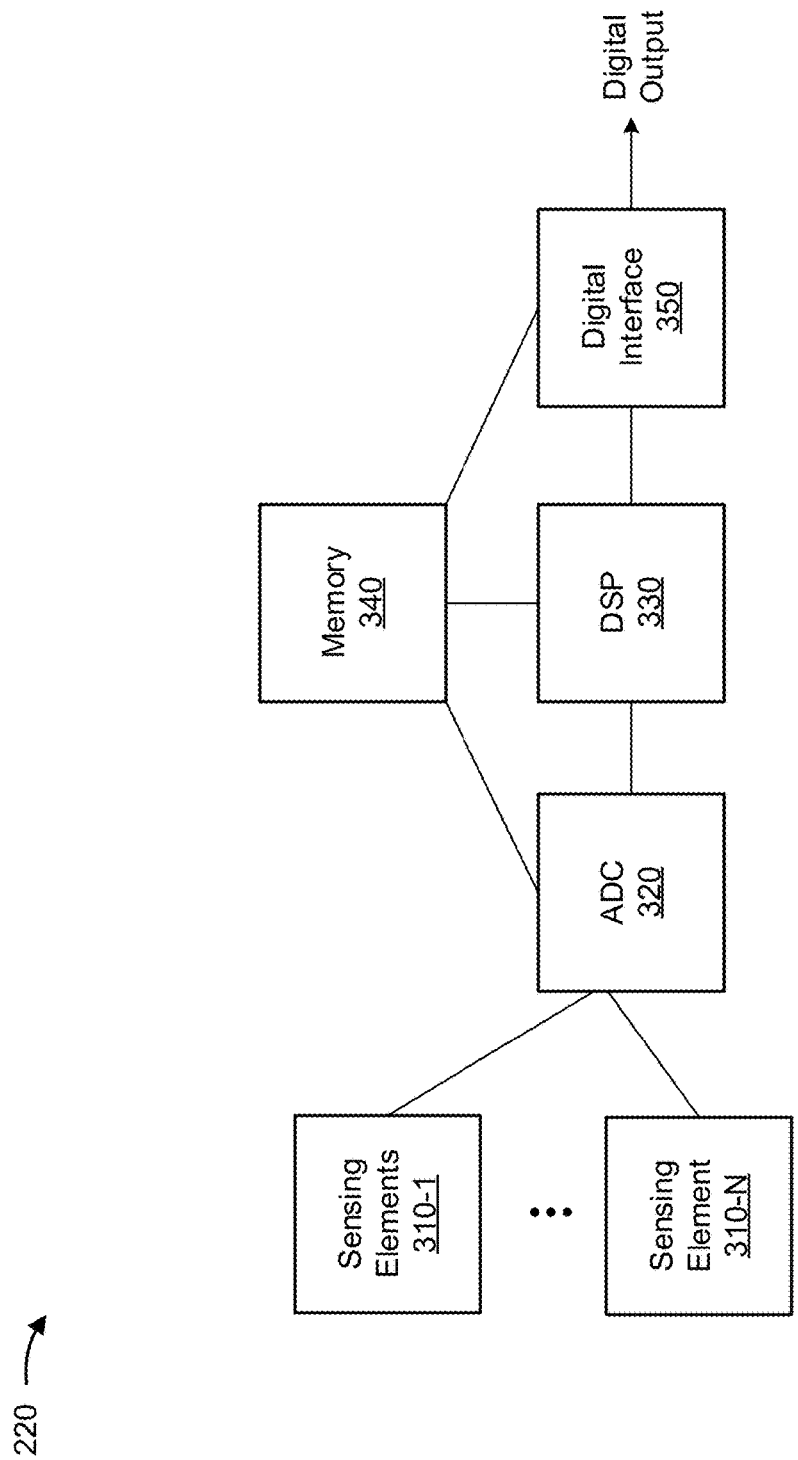
FIG. 3 is a diagram of an example magnetic sensor that may be included in the example environment of FIG. 2.

FIG. 3 is a diagram of example elements of magnetic sensor 220 of FIG. 2. As shown, magnetic sensor 220 may include a set of sensing elements 310-1 through 310-N (where N is an integer and N>1) (which may be referred to collectively as "sensing elements 310" or individually as "sensing element 310"), an analog-to-digital convertor (ADC) 320, a digital signal processor (DSP) 330, a memory 340, and a digital interface 350.

Sensing element 310 includes an element for sensing a component or set of components of a magnetic field present at magnetic sensor 220 (e.g., the magnetic field generated by magnet 215). For example, sensing element 310 may include a Hall-based sensing element, such as a Vertical Hall effect device (VHall), that operates based on a Hall-effect. As another example, sensing element 310 may include a magnetoresistive based (MR-based) sensing element (which may be referred to as an XMR), elements comprising a magnetoresistive material (e.g., nickel-iron (NiFe)), where the electrical resistance of the magnetoresistive material may depend on a strength and/or a direction of the magnetic field present at the magnetoresistive material. Here, sensing element 310 may be an anisotropic MR (AMR), a giant MR (GMR) effect, a tunnel MR (TMR), a magnetic tunneling junction (MTJ), and/or the like.

In some implementations, sensing element 310 may be a thin layer XMR, such that two dimensions (x, y) of sensing element 310 are much larger than a third orthogonal dimension (z). In such cases, vector components parallel to sensing element 310 may be referred to as in-plane components of the magnetic field. Further, a plane parallel to the flat sides of sensing element 310 may be referred to as the "XMR-plane." Vector components that are orthogonal or perpendicular to the XMR-plane may be referred to as out-of-plane components of the magnetic field.

Sensing elements 310 may be sputtered onto a substrate (e.g., a semiconductor chip) of magnetic sensor 220. Accordingly, a surface of the substrate may be the same as the XMR plane or xy-plane of magnetic sensor 220. Sensing elements 310 may be strong field or saturated XMRs (e.g., XMRs that respond only to in-plane components of the magnetic field). Additionally, or alternatively, sensing elements 310 may be weak field or non-saturated XMRs (e.g., XMRs that respond only to out-of-lane components of the magnetic field). In some implementations, the substrate is quadratic. For example, the substrate may be a semiconductor (e.g., a silicon die or silicon chip) with a width w and a height h. In some implementations, the width and/or height is between 1.00 mm and 3.00 mm.

In some implementations, magnetic sensor 220 may include one or more gradiometers comprised of one or more respective sets of sensing elements 310. For example, magnetic sensor 220 may include a first gradiometer that includes a first sensing element 310-1 and a second sensing element 310-2 that operate to sense a set of components of the magnetic field at the first sensing element 310-1 and the set of components at the second sensing element 310-2.

ADC 320 may include an analog-to-digital converter that converts an analog signal from the set of sensing elements 310 to a digital signal. For example, ADC 320 may convert analog signals, received from the set of sensing elements 310, into digital signals to be processed by DSP 330. ADC 320 may provide the digital signals to DSP 330. In some implementations, magnetic sensor 220 may include one or more ADCs 320.

DSP 330 may include a digital signal processing device or a collection of digital signal processing devices. In some implementations, DSP 330 may receive digital signals from ADC 320 and may process the digital signals to form output signals (e.g., destined for controller 225 as shown in FIG. 2), such as output signals associated with determining the angular position of magnet 215 about the center of rotational axis 210.

Memory 340 may include a read only memory (ROM) (e.g., an electrically erasable programmable read-only memory (EEPROM)), a random access memory (RAM), and/or another type of dynamic or static storage device (e.g., a flash memory, a magnetic memory, an optical memory, etc.) that stores information and/or instructions for use by magnetic sensor 220. In some implementations, memory 340 may store information associated with processing performed by DSP 330. Additionally, or alternatively, memory 340 may store configurational values or parameters for the set of sensing elements 310 and/or information for one or more other elements of magnetic sensor 220, such as ADC 320 or digital interface 350.

Digital interface 350 may include an interface via which magnetic sensor 220 may receive and/or provide information from and/or to another device, such as controller 225 (see FIG. 2). For example, digital interface 350 may provide the output signal, determined by DSP 330, to controller 225 and may further receive information from controller 225.

The number and arrangement of elements shown in FIG. 3 are provided as an example. In practice, magnetic sensor 220 may include additional elements, fewer elements, different elements, or differently arranged elements than those shown in FIG. 3. Additionally, or alternatively, a set of elements (e.g., one or more elements) of magnetic sensor 220 may perform one or more functions described as being performed by another set of elements of magnetic sensor 220.

Figure 4:
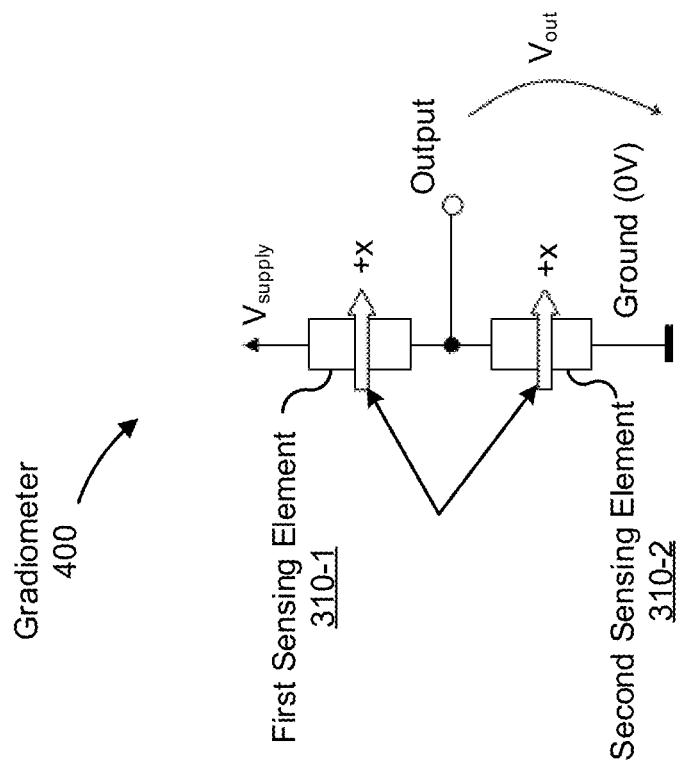
FIG. 4 is a diagram of example gradiometer that may be included within the magnetic sensor of FIG. 3.

FIG. 4 is a diagram of example gradiometer 400 that may be included within the magnetic sensor of FIG. 3. As shown in FIG. 4, gradiometer 400 is represented by a half bridge circuit that includes a first sensing element 310-1 and a second sensing element 310-2 and is supplied with voltage from a supply ($V_{supply}$) and sends an output signal ($V_{out}$). The first sensing element 310-1 and the second sensing element 310-2 are both configured to sense a magnetic field in a same direction (+x). Gradiometer 400 responds to differences in the magnetic field sensed by first sensing element 310-1 and second sensing element 310-2. For example, if first sensing element 310-1 is spaced apart from second sensing element 310-2 by a particular distance, $V_{out}$ may respond to the difference in the magnetic field on the two different locations by responding to the gradient (e.g., the slope of the field versus the spatial coordinate of the field). In some implementations, the distance may be at least 1 mm.

In some implementations, both first sensing element 310-1 and second sensing element 310-2 are implemented on a same substrate (e.g., a same silicon chip). In such cases, both first sensing element 310-1 and second sensing element 310-2 can be manufactured substantially simultaneously by a same process (e.g., via a same doping, a same direction of etching of the substrate, a same amount of dopant exposure of the substrate, and/or the like). Furthermore, when configured or positioned on a same substrate, first sensing element 310-2 and second sensing element 310-2 can be positioned relatively accurately with respect to each other (e.g., using a lithography that has a much smaller tolerance than if first sensing element 310-1 and second sensing element 310-2 were on separately aligned substrates). In some implementations, the substrate may have a dimension (e.g., a length and/or width) of at least 2 mm. Accordingly, in such cases, first sensing element 310-1 and second sensing element 310-2 can be spaced at least 2 mm apart. In some implementations, a configured distance between first sensing element 310-1 and second sensing element 310-2 may be based on one or more characteristics (e.g., magnetization, size, and/or the like) of magnet 215 and/or the magnetic field that is generated by magnet 215.

As indicated above, FIG. 4 is provided merely as an example. Other examples are possible and may differ from what was described with regard to FIG. 4.

Figure 5:
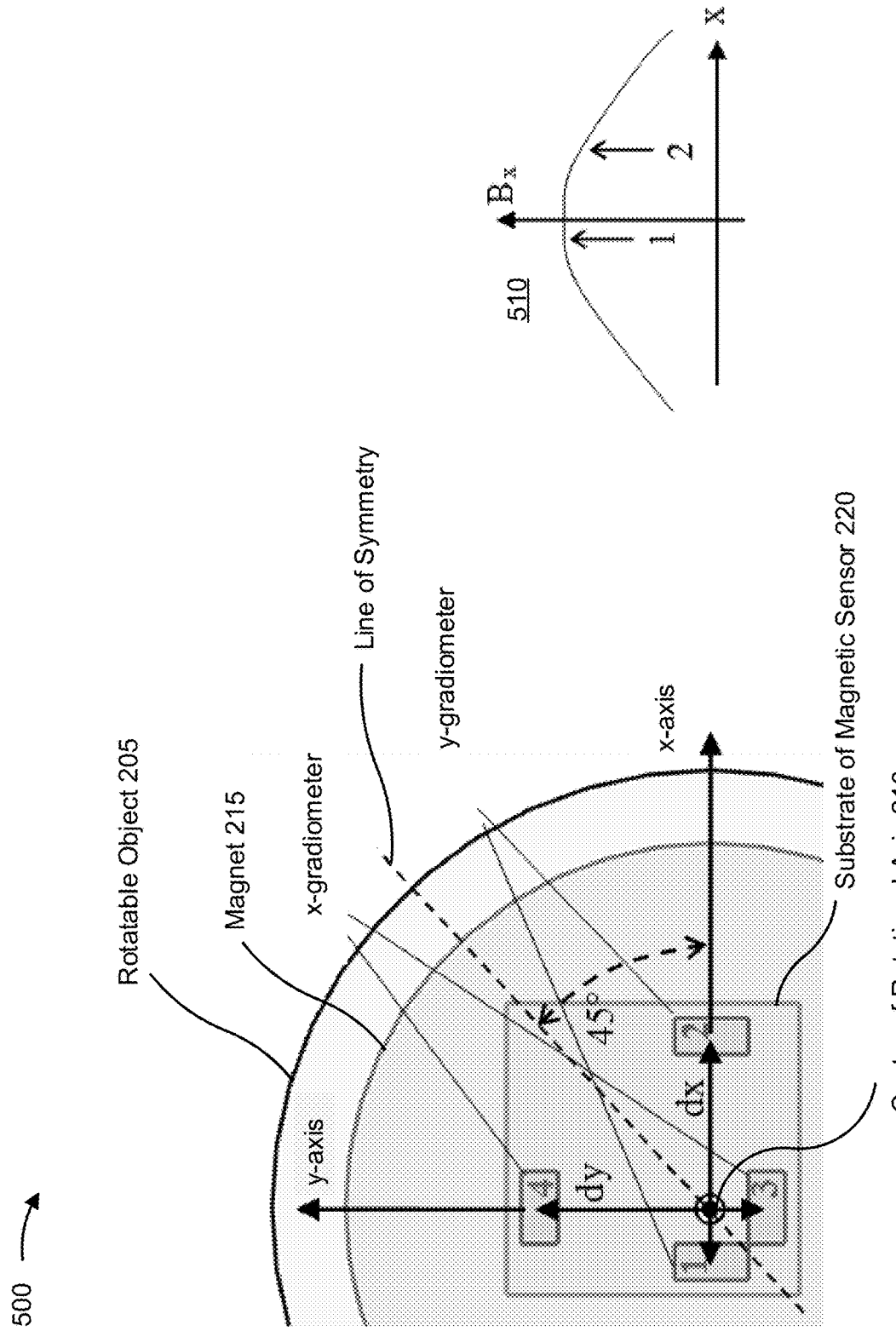
FIGS. 5-9 are diagrams associated with example implementations of a magnetic sensor arrangement described herein
Figure 6:
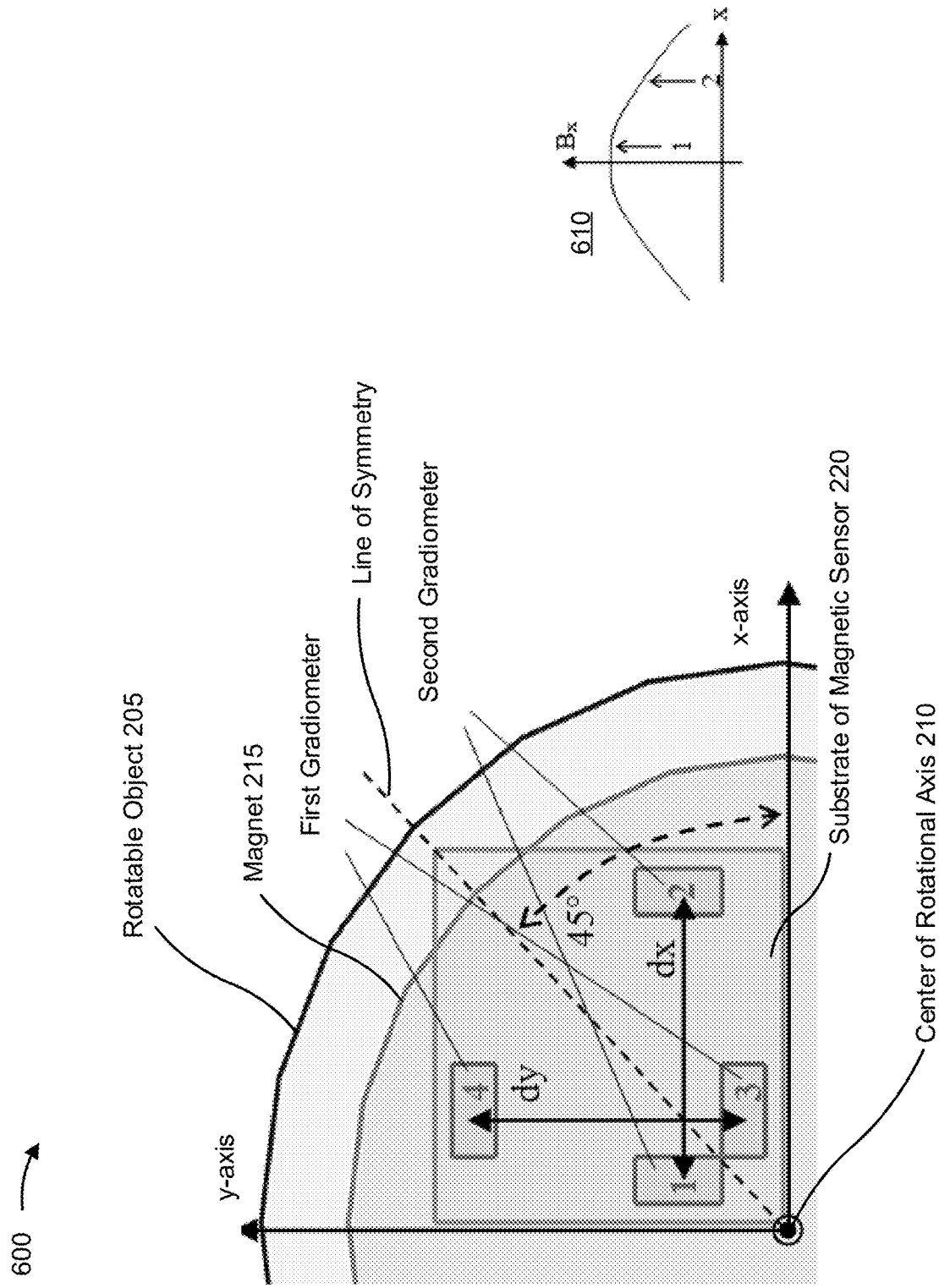
Figure 7:
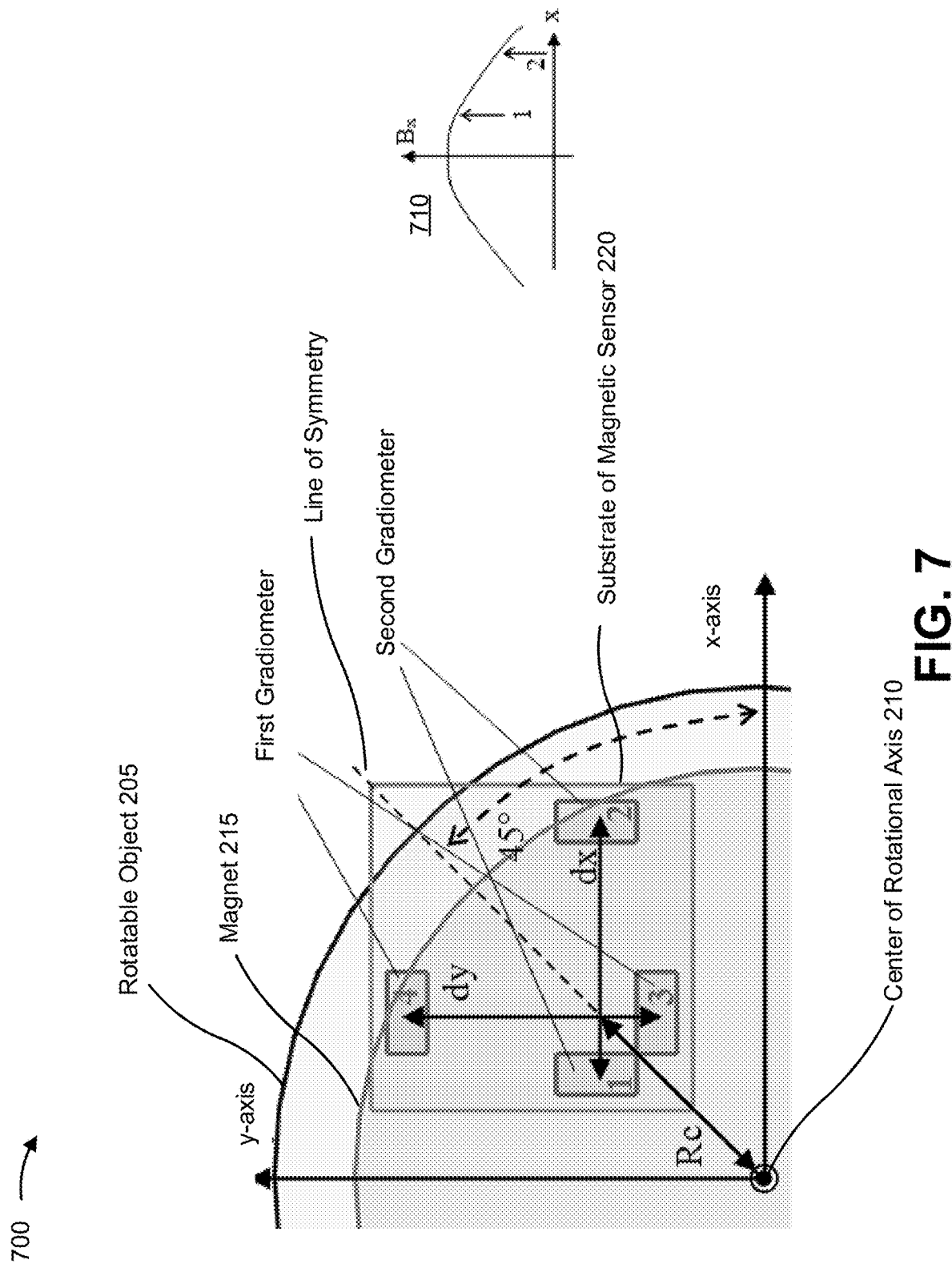

FIGS. 5-7 are diagrams associated with example implementations 500, 600, and 700, respectively, of a magnetic sensor arrangement described herein. In example implementations 500, 600, and 700, a substrate of magnetic sensor 220 (referred to in the following as "substrate") includes an x-gradiometer with sensing elements 1 and 2 (shown as "1" and "2") aligned along a first axis (shown as "dx") and a y-gradiometer with sensing elements 3 and 4 (shown as "3" and "4") aligned along a second axis (shown as "dy"). In some implementations, the first axis runs between a center of gravity of sensing element 1 and a center of gravity of sensing element 2 and the second axis runs between a center of gravity of sensing element 3 and a center of gravity of sensing element 4. The sensing elements 1 and 2 are symmetrical according to a radius (shown as a "Line of Symmetry") that runs from the center of rotational axis 210. An x-axis and y-axis are shown, in which the x-axis may correspond to a reference direction of magnetization of magnet 215. In some implementations, the first axis is parallel to the x-axis and the second axis is parallel to the y-axis and/or the first axis and second axis are perpendicular to one another. The symmetry of the arrangement of the x-gradiometer and the y-gradiometer (at a 45 degree angle from the x-axis) assures that signals $S_x$ and $S_y$ from x-gradiometer and y-gradiometer, respectively, are nominally the same in magnitude and shape, but shifted by the angular position.

In example implementations 500, 600, and 700, sensing element 1 is placed as close as possible to a left-side edge of the substrate and sensing element 3 is placed as close as possible to a bottom edge of the substrate. Furthermore, sensing element 2 is shifted parallel to the x-axis from sensing element 1 and as far to the right-side edge of the substrate and sensing element 4 is shifted parallel to the y-axis from sensing element 3 and as far to the top edge of the substrate. Accordingly, there may be a maximum spacing along a first edge direction between sensing element 1 and sensing element 2 of the x-gradiometer and a maximum spacing along a second edge direction between sensing element 3 and sensing element 4 of the y-gradiometer in the example configurations of the sensing elements in example implementations 500, 600, and 700. As such, in some implementations, a maximum output signal from the x-gradiometer and y-gradiometer in the respective configurations of example implementations 500, 600, and 700 may be achieved.

In example implementation 500 of FIG. 5, the substrate is arranged, relative to rotatable object 205 and/or magnet 215, such that a gradiometer intersection between the first axis and the second axis is aligned with a center of the rotational axis 210. As further shown in FIG. 5, the gradiometer intersection is offset from a center of the x-gradiometer and a center of the y-gradiometer. In some implementations, the gradiometer intersection may be offset from the center of the x-gradiometer or the center of the y-gradiometer.

When the gradiometer intersection is aligned with the rotational axis, as shown in example implementation 500 of FIG. 5, and when magnet 215 is in a zero-position (e.g., when the dipole moment aligns with the x-axis), the y-gradiometer may output $B_y=0$ and, when in 90 degree-position (e.g., when the dipole moment is shifted 90 degrees or along the y-axis), the x-gradiometer may output $dB_x=B_{x1}-B_{x2}=0$.

In other words, there may not be any offsets to account for because the gradiometer intersection is aligned with the center of the rotational axis. Accordingly, the configuration of the substrate, as shown in example implementation 500, may ensure that $S_x$ from the x-gradiometer is maximal when $S_y$ from the y-gradiometer crosses a zero (and vice versa), which provides an exact 90 degree phase shift. Accordingly, the configuration of the substrate in example implementation 500 can be beneficial when computing the angular position.

However, in some instances signal strength from the x-gradiometer and/or the y-gradiometer can be inhibited when using the example configuration of FIG. 5. For example, measurements of the magnet field component $B_x$ versus x are shown by the graph 510 when magnet 215 is at a zero-position and the dipole of magnet 215 points in a negative x-direction. As such, the measurements of the $B_x$ curve along x have a flat region (around x=0) and a rising steep region (in the negative x-direction) and falling steep region (in the positive x-direction). Because measurements by the x-gradiometer (shown by the "1" and "2") are both taken near the flat region, the strength of $S_x$ will be relatively small as ($B_{x2}-B_{x1}$) will be relatively small). Furthermore, if the substrate were to shift (e.g., due to assembly tolerances) in the positive x-direction, the size of $S_x$ would change. Accordingly, to avoid a change of $S_x$ despite a shift in the x-direction (to allow for certain tolerances), some implementations described herein may configure the substrate to be offset from the center of the rotational axis 210 such that the rotational axis 210 is not aligned with (e.g., is not aligned above or below) or does not run through the area of the substrate.

In example implementation 600 of FIG. 6, the substrate is arranged, relative to rotatable object 205 and/or magnet 215, such that a corner of the substrate is aligned with the center of the rotational axis. Accordingly, in example implementation 600, the gradiometer intersection between the first axis and the second axis of the x-gradiometer and y-gradiometer is offset from the center of the rotational axis 210. As further shown in FIG. 6, the gradiometer intersection is offset from a center of the x-gradiometer and a center of the y-gradiometer. In some implementations, the gradiometer intersection may be offset from the center of the x-gradiometer or the center of the y-gradiometer.

When the gradiometer intersection is not aligned with the rotational axis, as shown in example implementation 600 of FIG. 6, and when magnet 215 is in a zero-position (e.g., when the dipole moment aligns with the x-axis), the y-gradiometer may indicate an output that $dB_y$ ($B_{y1}-B_{y2}$) is approximately zero (as opposed to exactly zero as described in connection with FIG. 5) and, when in 90 degree-position (e.g., when the dipole moment is shifted 90 degrees or along the y-axis), the x-gradiometer may indicate an output that $dB_x$ is approximately 0 (as opposed to exactly zero as described in connection with FIG. 5). In other words, there may be an offset to account for because the gradiometer intersection is not aligned with the center of the rotational axis. Although the offset may need to be accounted for (e.g., when magnetic sensor 220 normalizes and/or combines signals from the x-gradiometer and y-gradiometer), the configuration of the substrate, as shown in example implementation 600, may ensure that $S_x$ from the x-gradiometer is maximal when Sy from the y-gradiometer crosses a zero (and vice versa), which provides a near (if not exact) 90 degree phase shift. Accordingly, the configuration of the substrate in example implementation 600 can be beneficial when computing the angular position.

Furthermore, the configuration of the substrate in example implementation 600 shifts the substrate relative to the configuration of example implementation 500. Therefore, the signal strength of $S_x$ and/or $S_y$ can be improved relative to the signal strength in example implementation 500. For example, as shown by graph 610, sensing element 1 and sensing element 2 have been shifted in the positive x-direction (corresponding to the shift of the substrate), relative to example implementation 500, such that sensing element 1 is nearer the falling steep region of the $B_x$ measurements and sensing element 2 is sensing $B_x$ further along the falling steep region of the $B_x$ measurements. Therefore, the signal strength of $S_x$ ($B_{x2}-B_{x1}$) can be improved and tolerance for a shift in the x-direction can be improved relative to example implementation 500. However, as shown by graph 610, sensing element 1 is not aligned along the falling steep region of the $B_x$ measurements, to fully avoid effects of a shift in the x-direction. Some implementations described herein shift the substrate to ensure that both sensing element 1 and sensing element 2 measure $B_x$ in the falling steep region to maximize signal strength and account for a shift in the x-direction.

In example implementation 700 of FIG. 7, the substrate is arranged, relative to rotatable object 205 and/or magnet 215, such that a corner of the substrate is offset from the center of the rotational axis and the center of the rotational axis is not aligned with or does not run through an area of the substrate. Accordingly, in example implementation 700, the gradiometer intersection between the first axis and the second axis of the x-gradiometer and y-gradiometer is further offset from the center of the rotational axis 210, relative to example implementation 600 of FIG. 6. As further shown in FIG. 7, the gradiometer intersection is offset from a center of the x-gradiometer and a center of the y-gradiometer. In some implementations, the gradiometer intersection may be offset from the center of the x-gradiometer or the center of the y-gradiometer.

When the gradiometer intersection is not aligned with the rotational axis, as shown in example implementation 700 of FIG. 7, there may be a greater offset to account for because the gradiometer intersection is substantially not aligned with the center of the rotational axis. Furthermore, a phase shift between $S_x$ from the x-gradiometer and $S_y$ from the y-gradiometer may not be out of phase by 90 degrees (e.g., the phase shift may be less than 80 degrees), which can cause some additional complexity with respect to calculating the angular position of magnet 215. However, $S_x$ and $S_y$ can be manipulated (e.g., normalized and/or combined using gains and/or offsets) to account for the offset. For example, the manipulation of $S_x$ and $S_y$ may be based on the distance between sensing element 1 and sensing element 2, the radial shift of the substrate from the center of the rotational axis, the characteristics of magnet 215 (e.g., the size of magnet 215, the size of an air gap between the substrate and magnet 215, and/or the like). As an example, to account for the non-orthogonality of $S_x$ and $S_y$, the reference directions can be turned from the x, y directions by manipulating $S_x$ and $S_y$, as shown above in Equations 2 and 3, where $S_{x2}=c_2*S_{x1}+S_y$, and phi=$\arctan_2(S_{x2}, S_y)$).

Furthermore, the configuration of the substrate in example implementation 700 further shifts the substrate relative to the configuration of example implementations 600. Therefore, the signal strength of $S_x$ and/or $S_y$ can be improved relative to the signal strength in example implementation 600. For example, as shown by graph 710, sensing element 1 and sensing element 2 have been shifted in the positive x-direction (corresponding to the shift of the substrate), relative to example implementation 600, such that sensing element 1 is within the falling steep region of the $B_x$ measurements along with sensing element 2. Therefore, the signal strength of $S_x$ ($B_{x2}-B_{x1}$) is improved and tolerance for a shift in the x-direction is further improved relative to example implementation 600. Accordingly, example implementation 700 may achieve relatively high signal strength of $S_x$, despite a shift of the substrate in the x-direction, by ensuring that both sensing element 1 and sensing element 2 measure $B_x$ in the falling steep region.

Notably, although reference is made in the preceding examples to the example configurations withstanding shifts in the x-direction and corresponding signal strengths of $S_x$, the configurations of example implementations 500, 600, and 700 may similarly withstand shifts in the y-directions and corresponding signal strengths of $S_y$.

As indicated above, FIGS. 5-7 is provided merely as an example. Other examples are possible and may differ from what was described with regard to FIGS. 5-7.

Figure 8:
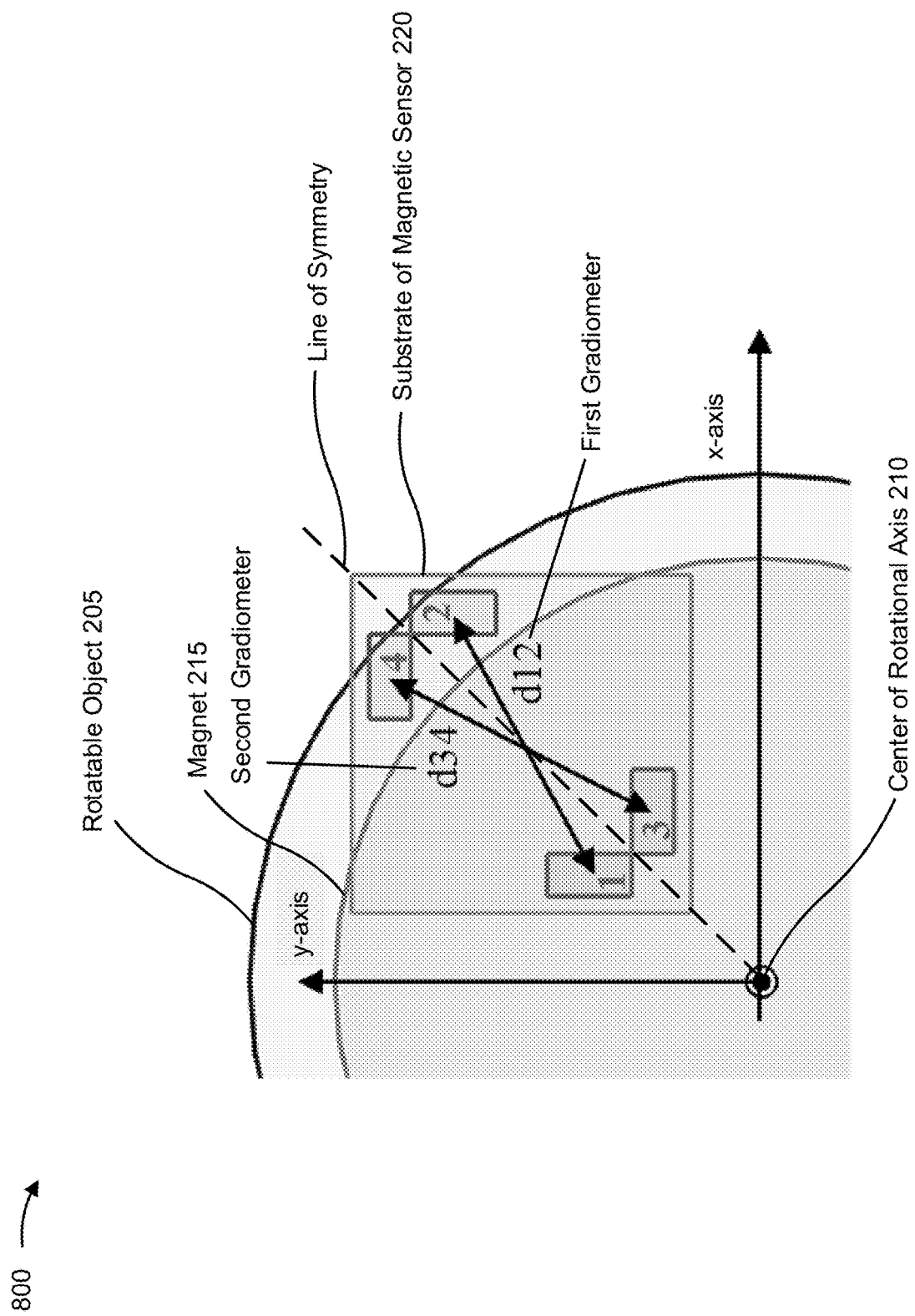
Figure 9:
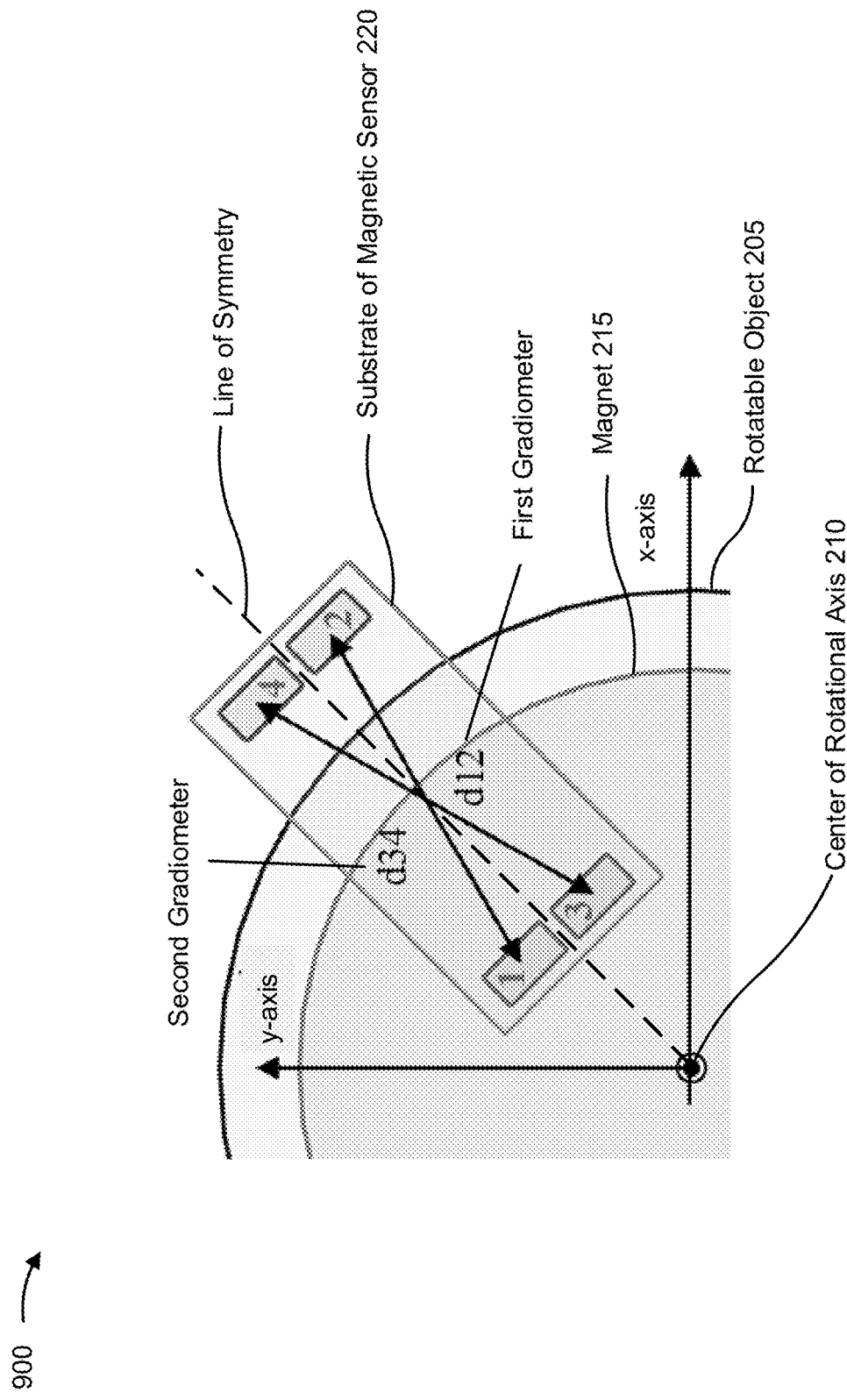

FIGS. 8 and 9 are diagrams associated with example implementations 800 and 900, respectively, of a magnetic sensor arrangement described herein. In example implementations 800 and 900, a substrate of magnetic sensor 220 (referred to in the following as "substrate") includes a first gradiometer with sensing elements 1 and 2 (shown as "1" and "2") aligned along a first axis (shown as "d12") and a second gradiometer with sensing elements 3 and 4 (shown as "3" and "4") aligned along a second axis (shown as "d34"). In some implementations, the first axis runs between a center of gravity of sensing element 1 and a center of gravity of sensing element 2 and the second axis runs between a center of gravity of sensing element 3 and a center of gravity of sensing element 4. As shown in FIGS. 8 and 9, at least one of the sensing elements of the first and second gradiometer are not aligned with (e.g., aligned below or aligned above) magnet 215. For example, a distance between sensing element 2 and the center of the rotational axis may be greater than the radius of magnet 215 (or the distance from a perimeter of magnet 215 to the center of rotational axis 210). In some implementations, all sensing elements of the substrate may be aligned with magnet 215 (e.g., with a plane defined by the perimeter of magnet 215). As such, the distance between each of the sensing elements 1-4 and the center of rotational axis 210 may be less than a radius of magnet 215.

The sensing elements 1 and 2 may be symmetrical according to a radius (shown as a "Line of Symmetry") that runs from the center of rotational axis 210. An x-axis and y-axis are shown, in which the x-axis may correspond to a reference direction of magnetization of magnet 215. However, the signals S12 and S34 from the first gradiometer and the second gradiometer, respectively, may have different magnitudes (e.g., due to misalignment with respective components of the magnetic field), but can be scaled to normalized amplitudes before computing the angular position (phi).

As shown in FIG. 8, in the configuration of example implementation 800, sensing element 1 is placed as close as possible to a left-side edge of the bottom left corner of the substrate and sensing element 3 is placed as close as possible to a bottom edge of the bottom left corner of the substrate. Furthermore, sensing element 2 is placed as far as possible toward a right side edge of the top right corner of the substrate and sensing element 4 is placed as far as possible toward a top edge of the top-right corner of the substrate. Accordingly, there may be a maximum spacing between sensing element 1 and sensing element 2 of the x-gradiometer and a maximum spacing between sensing element 3 and sensing element 4 of the y-gradiometer in the configuration of the sensing elements of example implementation 800. As such, in some implementations, a maximum output signal from the x-gradiometer and y-gradiometer in the respective configuration of example implementation 800 may be achieved.

In example implementation 800, the substrate is arranged, relative to rotatable object 205 and/or magnet 215 in a similar manner as example implementation 700, such that a corner of the substrate is offset from the center of the rotational axis and the center of the rotational axis is not aligned with or does not run through an area of the substrate. However, in example implementation 800, the first axis of the first gradiometer is aligned along a direction that is approximately 40 degrees relative to the positive x-direction and the second axis of the second gradiometer is aligned along a direction that is approximately 50 degrees relative to the positive x-direction. In example implementation 800, sensing element 1 and sensing element 2 are sensitive to the same component of the magnetic field (e.g., $B_x$ or 30 degrees rotated clockwise from the positive x-direction) and sensing element 3 and sensing element 4 are sensitive to the same component of the magnetic field (e.g., $B_y$ or 30 degrees counter-clockwise from the y-direction).

In some implementations, the configuration of the sensing elements of example implementation 800 may conserve surface space (e.g., chip space) of the substrate. For example, because the sensing elements are not located in all four corners of the substrate, the remaining chip area can be removed and/or utilized for different circuitry. In some implementations, further surface space of the substrate can be conserved by reshaping the substrate (e.g., to a rectangle).

As shown in FIG. 9, in the configuration of example implementation 900, the substrate is rectangular in shape and longitudinally shifted along the line of symmetry. Furthermore, sensing element 1 is placed in a first corner (bottom left corner) of the substrate, and sensing element 2 is placed in a second corner (top right corner) opposite the first corner and sensing element 1. Additionally, in example implementation 900, sensing element 3 is placed in a third corner (bottom right corner) of the substrate, and sensing element 4 is placed in a fourth corner (top left corner) opposite the third corner and sensing element 3.

The example configuration of example implementation 900 may conserve hardware resources and/or a size of the substrate (and thus the size of magnetic sensor 220), while maintaining accuracy in determining an angular position of magnet 215 and/or rotatable object 205.

As indicated above, FIGS. 8 and 9 are provided merely as an example. Other examples are possible and may differ from what was described with regard to FIGS. 8 and 9.

Figure 10:
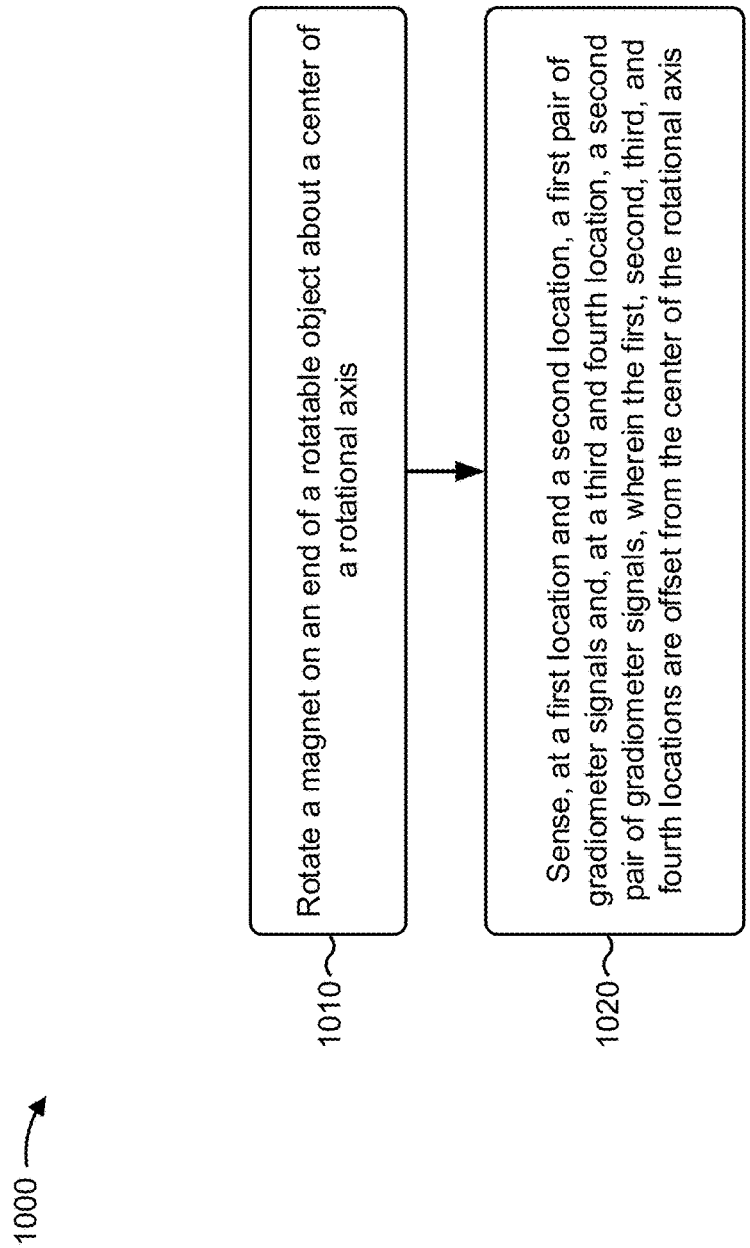
FIG. 10 is a flow chart of an example process associated with configuring a magnetic sensor arrangement as described herein.

FIG. 10 is a flow chart of an example process 1000 associated with using a magnetic sensor arrangement with multiple gradiometers as described herein. In some implementations, one or more process blocks of FIG. 10 may be performed by a machine associated with manufacturing magnetic sensor 220.

As shown in FIG. 10, process 1000 may rotating a magnet on an end of a rotatable object about a center of a rotational axis (block 1010). For example, magnet 215 may be connected to or formed as part of rotatable object 205. In some implementations, magnetic object 205 is rotated, causing magnet 215 to rotate. In some implementations, rotatable object 205 and/or magnet 215 are compatibly shaped to be fitted with or connected to one another.

As further shown in FIG. 10, process 1000 may include sensing, at a first location and a second location, a first pair of gradiometer signals and, at a third and fourth location, a second pair of gradiometer signals, wherein the first, second, third, and fourth locations are offset from the center of the rotational axis (block 1020). For example, magnetic sensor 220 may sense the first pair of gradiometer signals and the second pair of gradiometer signals.

In some implementations, the first axis is in a first plane and the second axis is in a second plane. In some implementations, the first plane and second plane are each perpendicular to the rotational axis. In some implementations, the first gradiometer center is offset from the center of the rotational axis and the second gradiometer center is offset from the center of the rotational axis. In some implementations, the first axis and the second axis intersect at a gradiometer intersection, the method further comprising positioning the gradiometer intersection to be offset from the center of the rotational axis. In some implementations, the first axis is configured to be perpendicular to the second axis on a substrate of the magnetic sensor.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

Accordingly, some implementations described herein provide a magnetic sensor arrangement that uses a plurality of gradiometers to determine an angular position or rotational angle of a rotatable shaft. According to some implementations herein, the gradiometers may be configured relative to a center of a rotational axis of the rotatable shaft to account for disturbances in a magnetic field associated with the rotatable object and/or provide relatively high signal strength over previous techniques. Furthermore, some implementations described herein may withstand misalignment or shifts of the magnetic sensor relative to a preconfigured position by placing magnetic sensor and/or configuring sensing elements within the magnetic sensor to measure one or more components of the magnetic field that provide the greatest signal strength. As such, increased accuracy in determining the angular position of the rotatable object over previous techniques can be achieved.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Some implementations are described herein to include a parallel relationship or a perpendicular relationship. As used herein, parallel is meant to cover substantially parallel and perpendicular is meant to cover substantially perpendicular. Further, as used herein, substantially refers to a described measurement, element, or relationship being within a tolerance (e.g., a design tolerance, a manufacturing tolerance, an industry standard tolerance, and/or the like).

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A magnetic sensor arrangement comprising:
   a magnetic sensor to:
      determine an angular position of a rotatable object,
         wherein the rotatable object is configured to rotate about a center of a rotational axis, and
         wherein the magnetic sensor includes a first gradiometer aligned on a first axis and a second gradiometer aligned on a second axis,
            wherein the first gradiometer comprises a first sensing element and a second sensing element,
            wherein the second gradiometer comprises a third sensing element and a fourth sensing element,
            wherein the first gradiometer comprises a first gradiometer center on the first axis and wherein the second gradiometer comprises a second gradiometer center on the second axis,
            wherein the first axis and the second axis are each perpendicular to the rotational axis,
            wherein the first gradiometer center is offset from the center of the rotational axis and the second gradiometer center is offset from the center of the rotational axis,
            wherein the first axis and the second axis intersect at a gradiometer intersection that is offset from at least one of the first gradiometer center or the second gradiometer center,
            wherein the gradiometer intersection is between the first sensing element and the second sensing element and between the third sensing element and the fourth sensing element, and wherein the first axis and the second axis are non-collinear, non-orthogonal, and non-parallel to each other;

sense, via the first gradiometer and the second gradiometer, a set of magnetic field components of a magnetic field generated by a magnet, wherein the set of magnetic field components are perpendicular to the rotational axis, and wherein the magnet is configured to co-rotate with the rotatable object; and determine, based on sensing the set of magnetic field components, the angular position of the rotatable object.

2. The magnetic sensor arrangement of claim 1, wherein the first sensing element and the second sensing element are configured to sense a first component of the magnetic field and the third sensing element and the fourth sensing element are configured to sense a second component of the magnetic field, wherein the first component is different from the second component.

3. The magnetic sensor arrangement of claim 1, wherein the first sensing element and the second sensing element are configured to be symmetrical to the third sensing element and the fourth sensing element relative to a radial axis that runs through the center of the rotational axis.

4. The magnetic sensor arrangement of claim 1, wherein the gradiometer intersection is offset from the center of the rotational axis of the rotatable object.

5. The magnetic sensor arrangement of claim 1, wherein the magnetic sensor is configured such that the center of the rotational axis of the rotatable object is not aligned with or does not run through an area associated with the first gradiometer and the second gradiometer, wherein the area is a tetragon with vertices corresponding to locations of the first sensing element, the second sensing element, the third sensing element, and the fourth sensing element.

6. The magnetic sensor arrangement of claim 1, wherein the magnetic sensor is configured such that the center of the rotational axis of the rotatable object is not aligned with or does not run through an area associated with the first gradiometer and the second gradiometer, wherein the area is a tetragon with a length based on a length of the first gradiometer and width corresponding to a length of the second gradiometer.

7. The magnetic sensor arrangement of claim 1, wherein the magnetic sensor, when determining the angular position of the rotatable object, is to:

normalize a first gradiometer signal from the first gradiometer and a second gradiometer signal from the second gradiometer based on a set of configured signal offsets and signal gains, wherein the first gradiometer signal and the second gradiometer signal include respective measurement information corresponding to the set of magnetic field components;

linearly combine the normalized first gradiometer signal and the normalized second gradiometer signal to obtain a normalized gradiometer signal; and determine the angular position based on the normalized gradiometer signal.

8. The magnetic sensor arrangement of claim 1, wherein at least one of the first sensing element or the second sensing element and at least one of the third sensing element or the fourth sensing element are a greater distance from the center of the rotational axis than a distance between a perimeter of the magnet and the center of the rotational axis.

9. The magnetic sensor arrangement of claim 1, wherein the first sensing element, the second sensing element, the third sensing element, and the fourth sensing element comprise magneto-resistive sensing elements.

10. The magnetic sensor arrangement of claim 1, wherein the magnetic sensor is included within a single semiconductor substrate.

11. The magnetic sensor arrangement of claim 1, wherein the magnet is positioned at an end of the rotatable object and the magnetic sensor is axially positioned a distance from the magnet such that an air gap exists between the magnet and the magnetic sensor.

12. A magnetic sensor, comprising:

a first gradiometer aligned along a first axis, wherein the first gradiometer comprises a first gradiometer center on the first axis, and wherein the first gradiometer comprises a first sensing element and a second sensing element;

a second gradiometer aligned along a second axis, wherein the second gradiometer comprises a third sensing element and a fourth sensing element, wherein the second gradiometer comprises a second gradiometer center of the second axis, wherein the first axis and the second axis are perpendicular to a center of a rotational axis of a rotatable object, wherein the first gradiometer center is offset from the center of the rotational axis and the second gradiometer center is offset from the center of the rotational axis, wherein the first axis and the second axis intersect at a gradiometer intersection that is offset from at least one of the first gradiometer center or the second gradiometer center, wherein the gradiometer intersection is between the first sensing element and the second sensing element and between the third sensing element and the fourth sensing element, wherein the first axis and the second axis are non-collinear, non-orthogonal, and non-parallel to each other, wherein the first sensing element, the second sensing element, the third sensing element, and the fourth sensing element are configured to sense a set of magnetic field components that are perpendicular to the center of the rotational axis, and wherein the set of magnetic field components are measured from a magnetic field generated by a magnet configured to co-rotate with the rotatable object; and a digital signal processor to:

determine, based on the set of magnetic field components, an angular position of the rotatable object.

13. The magnetic sensor of claim 12, wherein the first sensing element and the second sensing element are symmetrical to the third sensing element and the fourth sensing element relative to a radial axis that runs through the gradiometer intersection and the center of the rotational axis.

14. The magnetic sensor of claim 12, wherein the digital signal processor, when determining the angular position of the rotatable object, is to:

normalize a first gradiometer signal from the first gradiometer and a second gradiometer signal from the second gradiometer based on a set of configured signal offsets and signal gains, wherein the first gradiometer signal and the second gradiometer signal include respective measurement information corresponding to the set of magnetic field components;

linearly combine the normalized first gradiometer signal and the normalized second gradiometer signal to obtain a normalized gradiometer signal; and determine the angular position based on the normalized gradiometer signal.

15. The magnetic sensor of claim 12, wherein the gradiometer intersection is aligned with the center of the rotational axis.

16. The magnetic sensor of claim 12, wherein the gradiometer intersection is offset from the center of the rotational axis.

17. A method comprising:

rotating a magnet on an end of a rotatable object about a center of a rotational axis;

sensing, at a first location and a second location associated with a first gradiometer, a first pair of gradiometer signals and, at a third location and a fourth location associated with a second gradiometer, a second pair of gradiometer signals, wherein the first gradiometer comprises a first sensing element and a second sensing element, wherein the second gradiometer comprises a third sensing element and a fourth sensing element, wherein the first location, the second location, the third location, and the fourth location are offset from the center of the rotational axis, wherein a first gradiometer center is located along a first axis in a midpoint between the first location and the second location, wherein a second gradiometer center is located along a second axis in a midpoint between the third location and the fourth location, wherein the first axis and the second axis are each perpendicular to the rotational axis, wherein the first gradiometer center is offset from the center of the rotational axis and the second gradiometer center is offset from the center of the rotational axis, wherein the first axis and the second axis intersect at a gradiometer intersection that is offset from at least one of the first gradiometer center or the second gradiometer center, wherein the gradiometer intersection is between the first sensing element and the second sensing element and between the third sensing element and the fourth sensing element, and wherein the first axis and the second axis are non-collinear, non-orthogonal, and non-parallel to each other; and calculating a rotation angle based on the first pair of gradiometer signals and the second pair of gradiometer signals.

18. The method of claim 17, further comprising:

positioning a magnetic sensor that comprises the first gradiometer and the second gradiometer such that the gradiometer intersection is offset from the center of the rotational axis.

19. The method of claim 17, further comprising:

positioning the gradiometer intersection to be offset from the center of the rotational axis.

20. The method of claim 17, further comprising:

normalizing the first pair of gradiometer signals and the second pair of gradiometer signals to produce normalized gradiometer signals; and wherein calculating the rotation angle comprises:

calculating the rotation angle based on the normalized gradiometer signals.

* * * * *